US008649239B2

(12) United States Patent
Anand et al.

(10) Patent No.: US 8,649,239 B2
(45) Date of Patent: Feb. 11, 2014

(54) MULTI-BANK RANDOM ACCESS MEMORY STRUCTURE WITH GLOBAL AND LOCAL SIGNAL BUFFERING FOR IMPROVED PERFORMANCE

(75) Inventors: Darren L. Anand, Williston, VT (US); John A. Fifield, Underhill, VT (US); Mark D. Jacunski, Colchester, VT (US); Matthew C. Lanahan, East Fairfield, VT (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 13/479,448

(22) Filed: May 24, 2012

(65) Prior Publication Data

US 2013/0315022 A1 Nov. 28, 2013

(51) Int. Cl.
*G11C 8/00* (2006.01)
(52) U.S. Cl.
USPC .................................. 365/230.03; 365/230.06
(58) Field of Classification Search
USPC ........................................ 365/230.03, 230.06
See application file for complete search history.

(56) References Cited

U.S. PATENT DOCUMENTS

| | | | |
|---|---|---|---|
| 5,930,196 A | 7/1999 | Yim | |
| 6,032,220 A * | 2/2000 | Martin et al. | 711/5 |
| 6,718,499 B1 * | 4/2004 | Zuras, Jr. | 714/746 |
| 6,728,159 B2 | 4/2004 | Anand et al. | |
| 6,807,124 B2 * | 10/2004 | Tsuda et al. | 365/230.03 |
| 7,161,214 B2 | 1/2007 | Parris | |
| 7,161,867 B2 | 1/2007 | Kaku | |
| 7,286,423 B2 * | 10/2007 | Ramaraju | 365/203 |
| 7,287,103 B2 | 10/2007 | Ganfield et al. | |
| 7,443,737 B2 * | 10/2008 | Chu et al. | 365/189.05 |
| 7,471,556 B2 | 12/2008 | Chow et al. | |
| 7,679,973 B2 * | 3/2010 | Chu et al. | 365/189.05 |
| 8,040,719 B2 * | 10/2011 | Cho et al. | 365/163 |
| 8,289,764 B2 * | 10/2012 | Hanzawa | 365/163 |

* cited by examiner

*Primary Examiner* — Michael Tran
(74) *Attorney, Agent, or Firm* — Gibb & Riley, LLC; David A. Cain, Esq.

(57) ABSTRACT

Disclosed are embodiments of a multi-bank random access memory (RAM) structure that provides signal buffering at both the global and local connector level for improved performance. Specifically, inverters are incorporated into the global connector(s), which traverse groups of memory banks and which transmit signals (e.g., address signals, control signals, and/or data signals) from a memory controller, and also into alternating groups of local connectors, which connect nodes on the global connector(s) to corresponding groups of memory banks, such that any of the signals that are received by the memory banks from the memory controller via the global and local connectors are buffered by an even number of inverters and are thereby true signals. Signal buffering at both the global and local connector level results in relatively fast slews, short propagation delays, and low peak power consumption with minimal, if any, increase in area consumption.

25 Claims, 3 Drawing Sheets

MULTI-BANK RANDOM ACCESS MEMORY STRUCTURE WITH GLOBAL AND LOCAL SIGNAL BUFFERING FOR IMPROVED PERFORMANCE

BACKGROUND

1. Field of the Invention

The present disclosure relates to multi-bank random access memory (RAM) structures and, more specifically, to embodiments of a multi-bank random access memory (RAM) structure (e.g., a multi-bank embedded dynamic random access memory (eDRAM) structure or a multi-bank static random access memory (SRAM) structure) with a combination of global and local signal buffering (e.g., global and local control, address, and data signal buffering) for improved performance.

2. Description of the Related Art

In multi-bank random access memory (RAM) structures, such as multi-bank embedded dynamic random access memory (eDRAM) structures and multi-bank static random access memory (SRAM) structures, the performance of the global connectors, which carry signals (e.g., control signals, address signals and data signals) from a memory controller to the local connectors for the various memory banks, is critical to overall memory performance (i.e., to memory timing parameters, such as slew and propagation delay). Unfortunately, as scaling continues through and beyond the 32 nm technology node, the resistance-capacitance (RC) time constant of the lines (i.e., wires) which form such global connectors has increased. This increase in the RC time constant negatively impacts the ability of the global connectors, which are relatively long, to adequately drive the signals from the memory controller to the memory banks (i.e., to drive the signal to the multiple circuit loads) and, thereby results in poor slew rates. Thus, designers have incorporated buffers into such global connectors (e.g., between every 8 memory banks, between every 4 memory banks, etc.). The added buffers improve the slew rates, but do so at the expense of increased area consumption, increased peak power consumption and increased latency. Therefore, there is a need in the art for a multi-bank RAM structure (e.g., a multi-bank eDRAM structure or a multi-bank SRAM structure) with more efficient signal buffering.

SUMMARY

In view of the foregoing, disclosed herein are embodiments of a multi-bank random access memory (RAM) structure (e.g., a multi-bank embedded dynamic random access memory (eDRAM) structure or a multi-bank static random access memory (SRAM) structure) that provides signal buffering at both the global and local connector level for improved performance. Specifically, inverters are incorporated into the global connector(s), which traverse groups of memory banks, and also into alternating groups of local connectors, which connect nodes on the global connector(s) to corresponding groups of memory banks, such that any signals (e.g., address signals, control signals or data signals) that are received by the memory banks from the memory controller via the global and local connectors are buffered by an even number of inverters and are thereby true signals. Signal buffering at both the global and local connector level in this manner results in relatively fast slews, short propagation delays, and low peak power consumption with minimal, if any, increase in area consumption.

More particularly, disclosed herein are embodiments of a multi-bank random access memory (RAM) structure, such as a multi-bank embedded dynamic random access memory (eDRAM) structure or a multi-bank static random access memory (SRAM) structure.

In one embodiment, the multi-bank RAM structure can comprise groups of memory banks, a global connector, and groups of local connectors. The number of groups of local connectors can be equal to the number of groups of memory banks and the number of each local interconnect in each group (e.g., at least one local interconnect) can similarly be equal to the number of each memory bank in each group (e.g., also at least one). The global connector can traverse the groups of memory banks and the groups of local connectors can electrically connect nodes on the global connector to the groups of memory banks. Furthermore, the global connector can comprise first inverters electrically connected in series and each portion of the global connector between adjacent nodes (i.e., between adjacent groups of local connectors) can comprise only a single first inverter. Additionally, in alternating groups of local connectors across the global connector (i.e., in every other group across the global connector, such as in each odd numbered group across the global connector), each local connector can further comprise a second inverter such that any signals (e.g., address signals, control signals, or data signals) received by any memory bank via the global connector will be buffered by an even number of inverters and will thereby be true signals.

In another embodiment, the multi-bank RAM structure can comprise groups of memory banks, a plurality of global connectors, and groups of local connectors associated with each of the global connectors. The number of groups of local connectors associated with each one of the global connectors can be equal to the number of groups of memory banks and the number of each local interconnect in each group can similarly be equal to the number of each memory bank in each group. The global connectors can traverse the groups of memory banks and the groups of local connectors can electrically connect nodes on the global connectors to the groups of memory banks. Specifically, each group of local connectors can comprise multiple local connectors that electrically connect a same node on one of the global connectors to different memory banks in a corresponding group of memory banks. Furthermore, each global connector can comprise first inverters electrically connected in series and each portion of each of the global connectors between adjacent nodes (i.e., between adjacent groups of local connectors) can comprise only a single first inverter. Additionally, in alternating groups of local connectors across each of the global connectors (i.e., in every other group across the global connectors, such as, in each odd numbered group across the global connectors), each of the local connectors can further comprise a second inverter such that any signals received by any memory bank via any one of the global connectors will be buffered by an even number of inverters and will thereby be true signals.

In yet another embodiment, the multi-bank RAM structure can comprise groups of memory banks, a plurality of global connectors, and groups of local connectors associated with each of the global connectors. The number of groups of local connectors associated with each one of the global connectors can be equal to the number of groups of memory banks and the number of each local interconnect in each group can similarly be equal to the number of each memory bank in each group. The global connectors can traverse the groups of memory banks and the groups of local connectors can electrically connect nodes on the global connectors to the groups of memory banks. Specifically, each group of local connectors can comprise multiple local connectors that electrically connect a same node on one of the global connectors to different memory banks in a corresponding group of memory banks. Furthermore, each global connector can comprise first inverters electrically connected in series and each portion of each of the global connectors between adjacent nodes (i.e., between adjacent groups of local connectors) can comprise only a single first inverter. Additionally, in alternating groups of local connectors across the global connectors, each of the local connectors can further comprise a second inverter. However, in this case, positioning of the inverters on the global and local connectors is adjusted to provide a more even distribution of the second inverters across the multi-bank RAM structure.

Specifically, in this embodiment, the global connectors can comprise at least two global connectors (e.g., a first global connector and a second global connector) and one of these two global connectors (e.g., the second global connector) can incorporate an additional inverter at the start of the line (i.e., electrically connected in series to its initial first inverter). In order to ensure that any first signals (e.g., first write data signals, such as write 1 data signals), which are received by any memory bank via the first global connector, and any second signals (e.g., second write data signals, such as write 0 data signals), which are received by any memory bank via the second global connector, are buffered by an even number of inverters and are thereby true signals, the second inverters can be located in the local connectors of the odd numbered groups of local connectors across the first global connector, as in the previously described embodiments, but, due to the presence of the additional inverter, in the even numbered groups of local connectors across the second global connector.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, in multi-bank random access memory (RAM) structures, such as multi-bank embedded dynamic random access memory (eDRAM) structures and multi-bank static random access memory (SRAM) structures, the performance of the global connectors, which carry signals (e.g., control signals, address signals and data signals) from a memory controller to the local connectors for the various memory banks, is critical to overall memory performance (i.e., memory timing parameters, such as slew and propagation delay). Unfortunately, as scaling continues through and beyond the 32 nm technology node, the resistance-capacitance (RC) time constant of the lines (i.e., wires) which form such global connectors has increased. This increase in the RC time constant negatively impacts the ability of the global connectors, which are relatively long, to adequately drive the signals from the memory controller to the memory banks (i.e., to drive the signal to the multiple circuit loads) and, thereby results in poor slew rates. Thus, designers have incorporated buffers into such global connectors (e.g., between every 8 memory banks, between every 4 memory banks, etc.). The added buffers improve the slew rates, but do so at the expense of increased area consumption, increased peak power consumption and increased latency.

In view of the foregoing, disclosed herein are embodiments of a multi-bank random access memory (RAM) structure (e.g., a multi-bank embedded dynamic random access memory (eDRAM) structure or a multi-bank static random access memory (SRAM) structure) that provides signal buffering at both the global and local connector level for improved performance. Specifically, inverters are incorporated into the global connector(s), which traverse groups of memory banks, and also into alternating groups of local connectors, which connect nodes on the global connector(s) to corresponding groups of memory banks, such that any signals (e.g., address signals, control signals or data signals) that are received by the memory banks from the memory controller via the global and local connectors are buffered by an even number of inverters and are thereby true signals. Signal buffering at both the global and local connector level in this manner results in relatively fast slews, short propagation delays, and low peak power consumption with minimal, if any, increase in area consumption.

Figure 1:
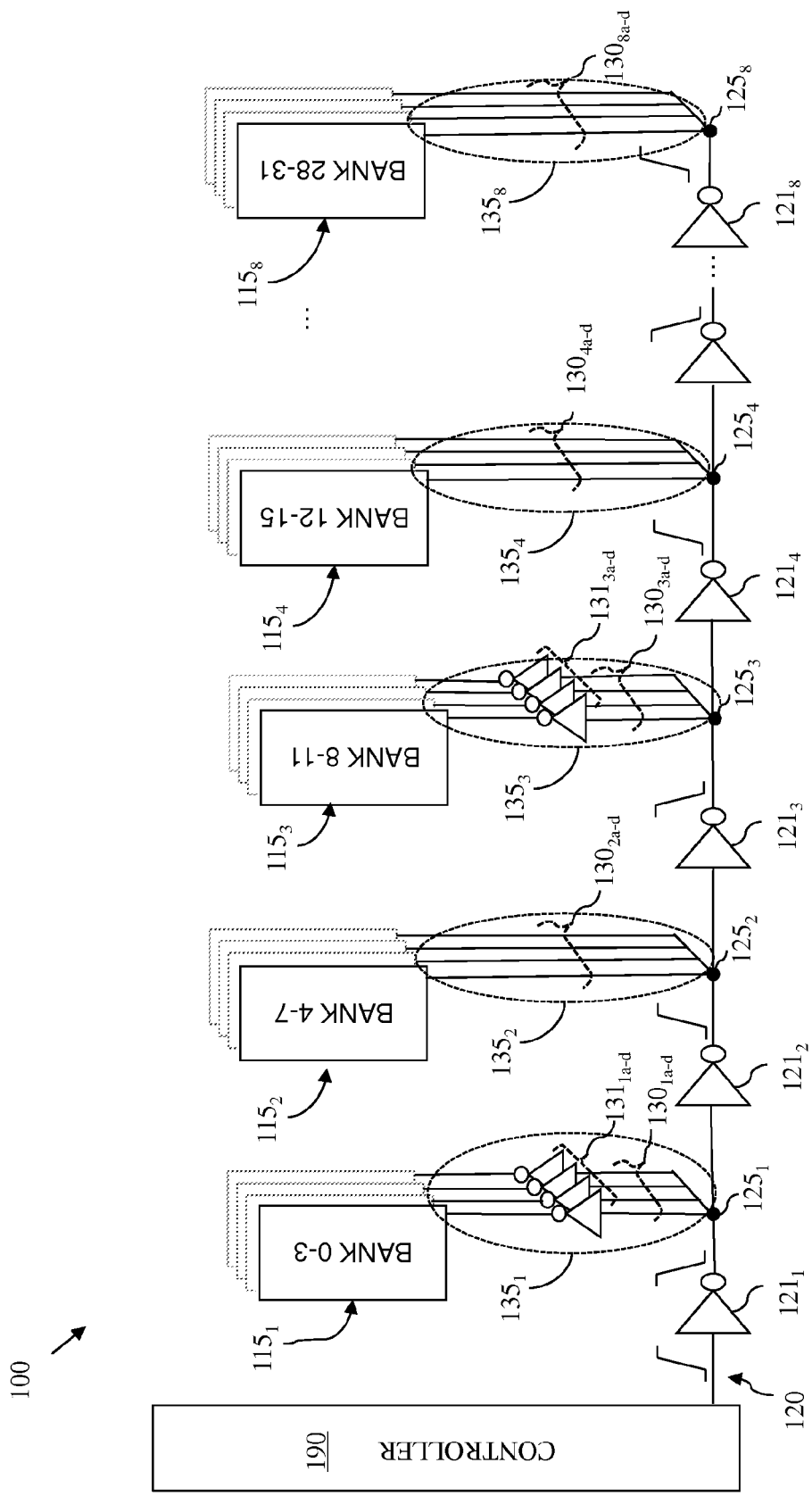
FIG. 1 is a schematic drawing illustrating an embodiment of a multi-bank random access memory (RAM) structure.
Figure 2:
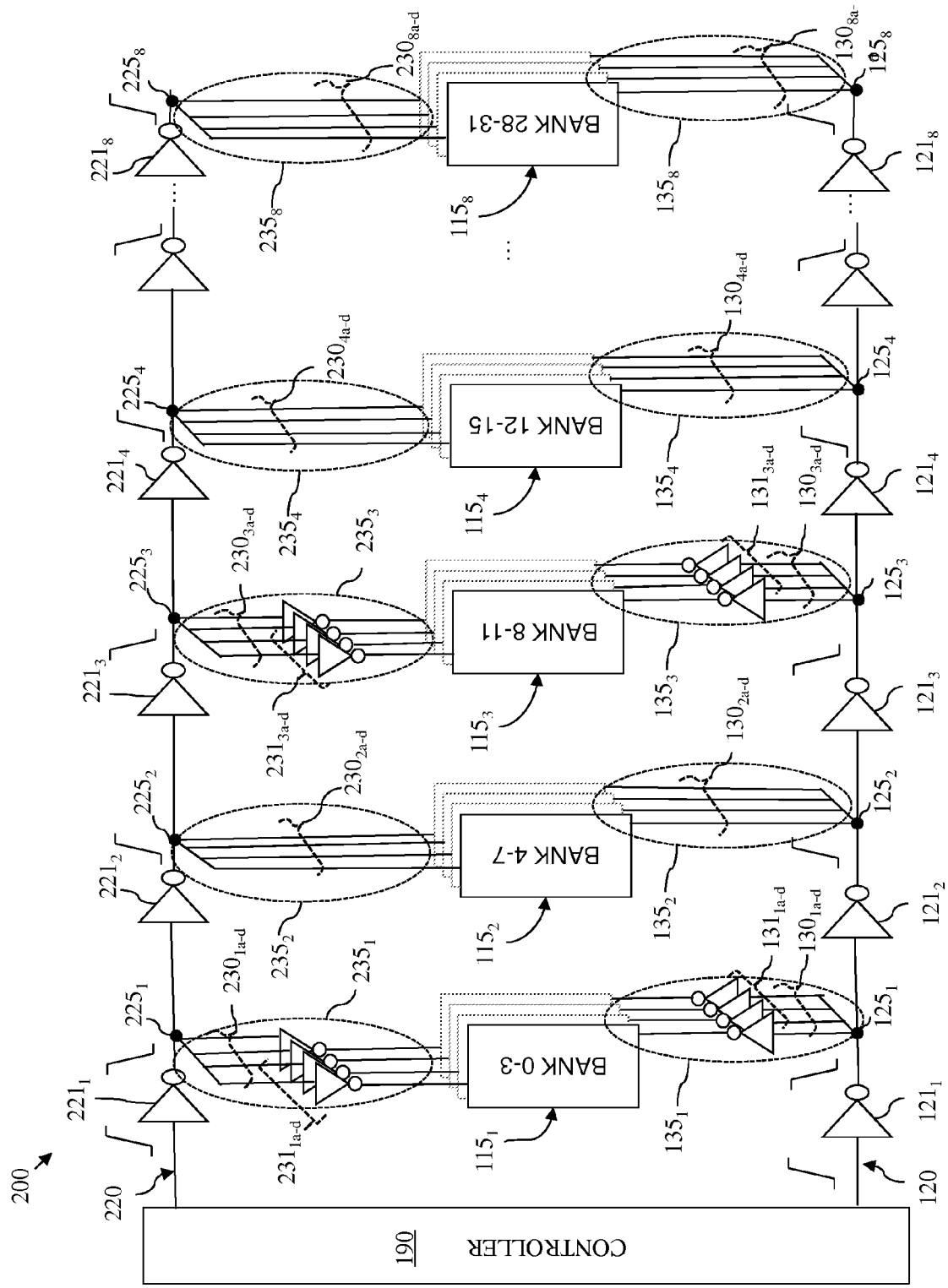
FIG. 2 is a schematic drawing illustrating another embodiment of a multi-bank random access memory (RAM) structure.
Figure 3:
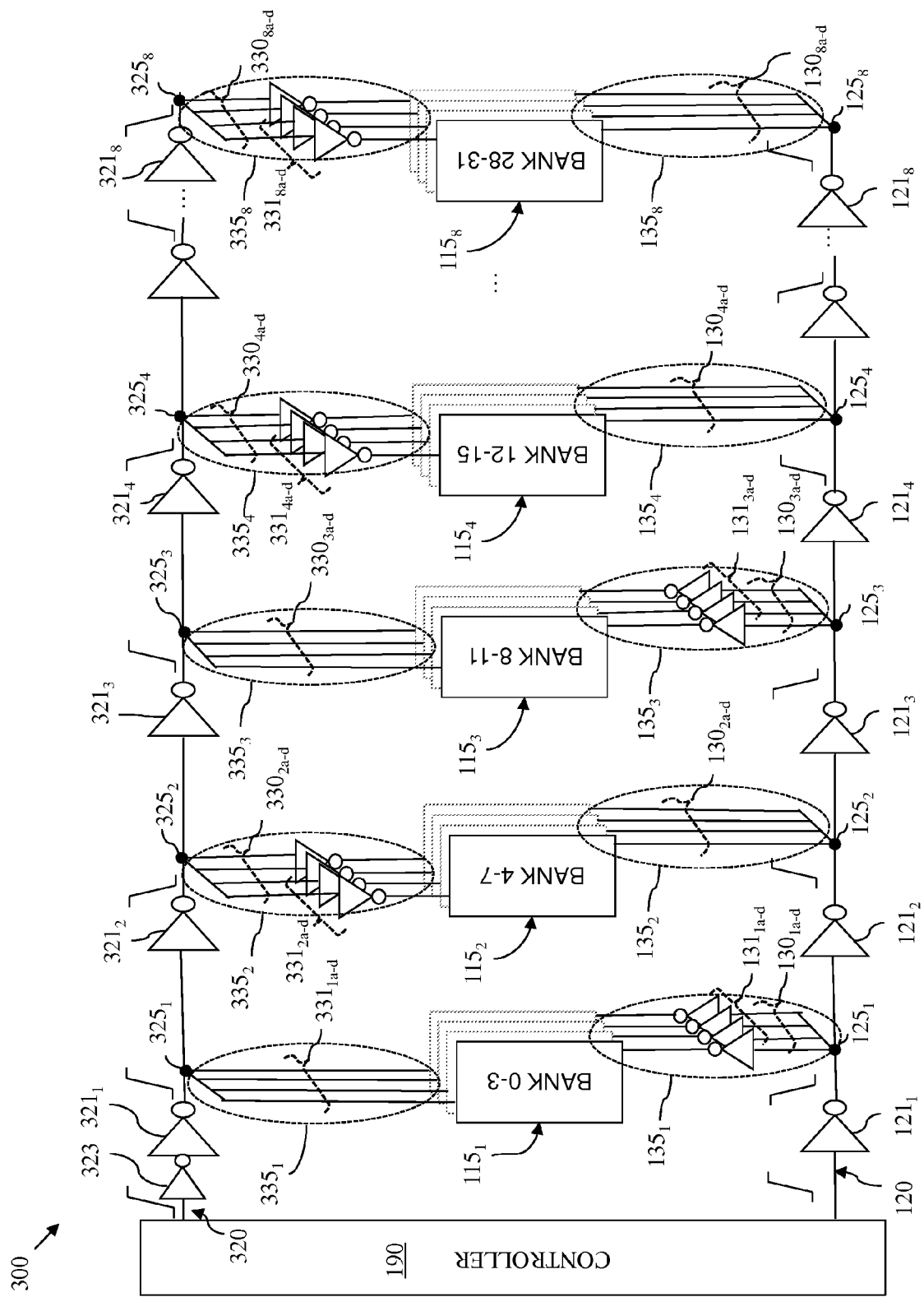
FIG. 3 is a schematic drawing illustrating yet another embodiment of a multi-bank random access memory (RAM) structure.

More particularly, referring to FIGS. 1-3 disclosed herein are embodiments of a multi-bank random access memory (RAM) structure 100, 200, 300, respectively. These multi-bank RAM structures 100, 200, 300 can comprise, for example, multi-bank embedded dynamic random access memory (eDRAM) structures or multi-bank static random access memory (SRAM) structures. Each of the multi-bank RAM structures 100, 200, 300 can comprise groups $115_1$-$115_8$ of memory banks (also referred to as memory arrays), such as eDRAM banks or SRAM banks. eDRAM banks and SRAM banks are well known in the art and, thus, the details of such memory banks are omitted from this specification in order to allow the reader to focus on the salient aspects of the disclosed embodiments. For illustration purposes, the multi-bank RAM structures 100, 200, 300 are each shown in FIGS. 1-3 as a 32-bank RAM structure with eight groups of four memory banks each (see memory banks 0-3 of group $115_1$, memory banks 4-7 of group $115_2$, memory banks 8-11 of group $115_3$, memory banks 12-15 of group $115_4$, and so on until memory banks 28-31 of group $115_8$). However, it should be understood that alternatively these multi-bank RAM structures 100, 200, 300 could comprise any number of two or more groups of memory banks, where each group comprises at least one memory bank.

As in conventional multi-bank RAM structures, the multi-bank RAM structures 100, 200, 300 disclosed herein can each further a memory controller 190 that transmits signals to the various memory banks via global connectors, which traverse the groups of memory banks, and local connectors, which electrically connect the global connectors to the memory banks. These signals can include, but are not limited to, address signals (e.g., row address signals and column address signals), control signals (e.g., row address strobe (RAS) signals, column address strobe (CAS) signals, etc.), and data signals (e.g., write data signals). However, in order to drive these signals from the memory controller 190 across the global and local connectors to the memory banks within the multi-bank RAM structures 100, 200 and 300, strategically placed inverters can be incorporated into the global and local connectors to provide a combination of global and local signal buffering. For purposes of this disclosure, the term "inverter" refers to an inverting buffer or inverting gate. This combination of global and local signal buffering distinguishes the multi-bank RAM structures 100, 200, 300 from conventional multi-bank RAM structures, which typically only provide for global signal buffering (i.e., which typically only provide for signal buffering within the global connectors).

Specifically, referring to FIG. 1, one embodiment of a multi-bank RAM structure 100 can comprise groups $115_1$-$115_8$ of memory banks, a global connector 120, and groups $135_1$-$135_8$ of local connectors $130_{1a\text{-}a}$-$130_{8a\text{-}d}$. It should be noted that the number of groups $135_1$-$135_8$ of local connectors is equal to the number of groups $115_1$-$115_8$ of memory banks and the number of each local interconnect in each group (e.g., at least one local interconnect) is similarly be equal to the number of each memory bank in each group (e.g., also at least one).

The global connector 120 can be connected to an output of the memory controller 190 and can receive signals (e.g., address signals, control signals or data signals) from the memory controller 190. The global connector 120 can further traverse the groups $115_1$-$115_8$ of memory banks.

The groups $135_1$-$135_8$ of local connectors can electrically connect nodes $125_1$-$125_8$ on the global connector 120 to the groups $115_1$-$115_8$ of memory banks. That is, each one of the groups $135_1$-$135_8$ of local connectors can comprise local connector(s) that connect a same node on the global connector 120 to the memory bank(s) in a corresponding one of the groups $115_1$-$115_8$ of memory banks. For example, multiple local connectors $130_{1a\text{-}d}$ of group $135_1$ connect node $125_1$ on the global connector 120 to the memory banks 0-3 in the corresponding group $115_1$ of memory banks; multiple local connectors $130_{2a\text{-}d}$ of group $135_2$ connect node $125_2$ on the global connector 120 to the memory banks 4-7 in the corresponding group $115_2$ of memory banks; multiple local connectors $130_{3a\text{-}d}$ of group $135_3$ connect node $125_3$ on the global connector 120 to the memory banks 8-11 in the corresponding group $115_3$ of memory banks; multiple local connectors $130_{4a\text{-}d}$ of group $135_4$ connect node $125_4$ on the global connector 120 to the memory banks 12-15 in the corresponding group $115_4$ of memory banks; and so on until multiple local connectors $130_{8a\text{-}d}$ of group $135_8$ connect node $125_8$ on the global connector 120 to the memory banks 28-31 in the corresponding group $115_8$ of memory banks.

Furthermore, the global connector 120 can comprise first inverters $121_1$-$121_8$ electrically connected in series and each portion of the global connector 120 between adjacent nodes (i.e., between adjacent groups of local connectors) can comprise only a single first inverter. For example, the portion of the global connector 120 between the nodes $125_1$ and $125_2$ (i.e., between the local connector groups $135_1$ and $135_2$) comprises the single first inverter $121_2$; the portion of the global connector 120 between the nodes $125_2$ and $125_3$ (i.e., between the local connector groups $135_2$ and $135_3$) comprises the single first inverter $121_3$; the portion of the global connector 120 between the nodes $125_3$ and $125_4$ (i.e., between the local connector groups $135_3$ and $135_4$) comprises the single first inverter $121_4$, and so on.

Finally, in alternating groups of local connectors across the global connector 120 (i.e., in every other group across the global connector 120, such as in each odd numbered group, across the global connector 120), each of the local connectors can further comprise a second inverter for correcting the signal polarity and for driving the signal to a single memory bank (i.e., for driving a single circuit load). For example, see the second inverters $131_{1a\text{-}d}$ in the local connectors $130_{1a\text{-}d}$ of the odd numbered group $135_1$ which follows an odd number (i.e., 1) of inverters; the second inverters $131_{3a\text{-}d}$ in the local connectors $130_{3a\text{-}d}$ of the odd numbered group $135_3$ which follows an odd number (i.e., 3) of first inverters; and so on. Configured in this manner, any signals (e.g., address signals, control signals, or data signals) received by any memory bank via the global connector 120 and a local connector will be buffered by an even number of inverters and will thereby be true signals. For purposes of this disclosure, the phrase "true signal" refers to a signal that has the same polarity at the input to the memory bank as it did at the output of the memory controller.

It should be noted that any one or more of the signals that are transmitted from the memory controller to the memory banks of a multi-bank RAM structure can buffered using a combination of global and local signal buffering, as described above and shown in FIG. 1. Thus, for example, referring to FIG. 2, another embodiment of a multi-bank RAM structure 200 can comprise groups $115_1$-$115_8$ of memory banks, a plurality of global connectors (see global connector 120 and global connector 220), and groups of local connectors associated with each of the global connectors (see the groups $135_1$-$135_8$ of local connectors $130_{1a\text{-}d}$-$130_{8a\text{-}d}$ associated with the global connector 120 and the groups $235_1$-$235_8$ of local connectors $230_{1a\text{-}d}$-$230_{8a\text{-}d}$ associated with the global connector 220). It should be noted that the number of groups of local connectors associated with each one of the global connectors is equal to the number of groups of memory banks and the number of each local interconnect in each group is similarly equal to the number of each memory bank in each group.

The global connectors 120, 220 can be connected to different outputs of the memory controller 190 and can receive different signals (e.g., different address signals, different control signals, different data signals or a combination thereof, such as an address signal and a control signal, etc.) from the memory controller 190. The global connectors 120, 220 can each further traverse the groups $115_1$-$115_8$ of memory banks.

The groups of local connectors can electrically connect nodes on the global connectors to the groups of memory banks. Specifically, the group's $135_1$-$135_8$ of local connectors can electrically connect nodes $125_1$-$125_8$ on the global connector 120 to the groups $115_1$-$115_8$ of memory banks. That is, as described in detail above with regard to the multi-bank RAM structure 100 of FIG. 1, each one of the groups $135_1$-$135_8$ of local connectors can comprise local connector(s) that connect a same node on the global connector 120 to the memory bank(s) in a corresponding one of the groups $115_1$-$115_8$ of memory banks. Similarly, the group's $235_1$-$235_8$ of local connectors can electrically connect nodes $225_1$-$225_8$ on the global connector 220 to the groups $115_1$-$115_8$ of memory banks. That is, each one of the groups $235_1$-$235_8$ of local connectors can comprise local connector(s) that connect a same node on the global connector 220 to the memory bank(s) in a corresponding one of the groups $115_1$-$115_8$ of memory banks. For example, multiple local connectors $230_{1a\text{-}d}$ of group $235_1$ connect node $225_1$ on the global connector 220 to the memory banks 0-3 in the corresponding group $215_1$ of memory banks; multiple local connectors $230_{2a\text{-}d}$ of group $235_2$ connect node $225_2$ on the global connector 220 to the memory banks 4-7 in the corresponding group $215_2$ of memory banks; multiple local connectors $230_{3a\text{-}d}$ of group $235_3$ connect node $225_3$ on the global connector 220 to the memory banks 8-11 in the corresponding group $215_3$ of memory banks; multiple local connectors $230_{4a\text{-}d}$ of group $235_4$ connect node $225_4$ on the global connector 220 to the memory banks 12-15 in the corresponding group $215_4$ of memory banks; and so on until multiple local connectors $230_{8a-d}$ of group $235_8$ connect node $225_8$ on the global connector 220 to the memory banks 28-31 in the corresponding group $215_8$ of memory banks.

Furthermore, the global connectors can each comprise first inverters electrically connected in series and each portion of the global connector between adjacent nodes (i.e., between adjacent groups of local connectors) can comprise only a single first inverter. Specifically, the global connector 120 can comprise first inverters $121_1$-$121_8$ electrically connected in series and each portion of the global connector 120 between adjacent nodes (i.e., between adjacent groups of local connectors) can comprise only a single first inverter, as described in detail above with regard to the multi-bank RAM structure 100 of FIG. 1. Similarly, the global connector 220 can comprise first inverters $221_1$-$221_8$ electrically connected in series and each portion of the global connector 220 between adjacent nodes (i.e., between adjacent groups of local connectors) can comprise only a single first inverter. For example, the portion of the global connector 220 between the nodes $225_1$ and $225_2$ (i.e., between the local connector groups $235_1$ and $235_2$) comprises the single first inverter $221_2$; the portion of the global connector 220 between the nodes $225_2$ and $225_3$ (i.e., between the local connector groups $235_2$ and $235_3$) comprises the single first inverter $221_3$; the portion of the global connector 220 between the nodes $225_3$ and $225_4$ (i.e., between the local connector groups $235_3$ and $235_4$) comprises the single first inverter $221_4$, and so on.

Finally, in alternating groups of local connectors across each of global connectors 120, 220 (i.e., in every other group across the global connectors and, particularly, in each odd numbered group, across the global connectors), each of the local connectors can further comprise a second inverter for correcting the signal polarity (i.e., the data polarity) and for driving the signal to a single memory bank (i.e., for driving a single circuit load). For example, with regard to the global connector 120, see the second inverters $131_{1a-d}$ in the local connectors $130_{1a-d}$ of the odd numbered group $135_1$ which follows an odd number (i.e., 1) of inverters; the second inverters $131_{3a-d}$ in the local connectors $130_{3a-d}$ of the odd numbered group $135_3$ which follows an odd number (i.e., 3) of first inverters; and so on. Similarly, with regard to the global connector 220, see the second inverters $231_{1a-d}$ in the local connectors $230_{1a-d}$ of the odd numbered group $235_1$ which follows an odd number (i.e., 1) of inverters; the second inverters $231_{3a-d}$ in the local connectors $230_{3a-d}$ of the odd numbered group $235_3$ which follows an odd number (i.e., 3) of first inverters; and so on. Configured in this manner, any signals received by any memory bank via either of the global connectors 120, 220 and a local connector will be buffered by an even number of inverters and will thereby be true signals.

As mentioned above, any one or more of the signals that are transmitted from the memory controller 190 to the memory banks of a multi-bank RAM structure can be buffered using a combination of global and local signal buffering. However, as shown in FIG. 2, non-uniform device density may become an issue when only the local connectors to the odd numbered groups of memory banks contain second inverters. Thus, referring to FIG. 3, in yet another embodiment of a multi-bank RAM structure 300 the positioning of inverters on the global and local connectors can be adjusted to provide a more even distribution of the second inverters (i.e., the local inverters) across the multi-bank RAM structure 300.

Specifically, the multi-bank RAM structure 300 can comprise groups $115_1$-$115_8$ of memory banks, a plurality of global connectors (see global connector 120 and global connector 320), and groups of local connectors associated with each of the global connectors (see the groups $135_1$-$135_8$ of local connectors $130_{1a-d}$-$130_{8a-d}$ associated with the global connector 120 and the groups $335_1$-$335_8$ of local connectors $330_{1a-d}$-$330_{8a-d}$ associated with the global connector 320). It should be noted that the number of groups of local connectors associated with each one of the global connectors is equal to the number of groups of memory banks and the number of each local interconnect in each group is similarly equal to the number of each memory bank in each group.

The global connectors 120, 320 can be connected to different outputs of the memory controller 190 and can receive different signals (e.g., different address signals, different control signals, different data signals or a combination thereof, such as an address signal and a control signal, etc.) from the memory controller 190. The global connectors 120, 320 can each further traverse the groups $115_1$-$115_8$ of memory banks.

The groups of local connectors can electrically connect nodes on the global connectors to the groups of memory banks. Specifically, the group's $135_1$-$135_8$ of local connectors can electrically connect nodes $125_1$-$125_8$ on the global connector 120 to the groups $115_1$-$115_8$ of memory banks. That is, as described in detail above with regard to the multi-bank RAM structure 100 of FIG. 1, each one of the groups $135_1$-$135_8$ of local connectors can comprise local connector(s) that connect a same node on the global connector 120 to the memory bank(s) in a corresponding one of the groups $115_1$-$115_8$ of memory banks. Similarly, the group's $335_1$-$335_8$ of local connectors can electrically connect nodes $325_1$-$325_8$ on the global connector 320 to the groups $115_1$-$115_8$ of memory banks. That is, each one of the groups $335_1$-$335_8$ of local connectors can comprise local connector(s) that connect a same node on the global connector 320 to the memory bank(s) in a corresponding one of the groups $115_1$-$115_8$ of memory banks. For example, multiple local connectors $330_{1a-d}$ of group $335_1$ connect node $325_1$ on the global connector 320 to the memory banks 0-3 in the corresponding group $315_1$ of memory banks; multiple local connectors $330_{2a-d}$ of group $335_2$ connect node $325_2$ on the global connector 320 to the memory banks 4-7 in the corresponding group $315_2$ of memory banks; multiple local connectors $330_{3a-d}$ of group $335_3$ connect node $325_3$ on the global connector 320 to the memory banks 8-11 in the corresponding group $315_3$ of memory banks; multiple local connectors $230_{4a-d}$ of group $335_4$ connect node $325_4$ on the global connector 320 to the memory banks 12-15 in the corresponding group $315_4$ of memory banks; and so on until multiple local connectors $330_{8a-d}$ of group $335_8$ connect node $325_8$ on the global connector 320 to the memory banks 28-31 in the corresponding group $315_8$ of memory banks.

Furthermore, the global connectors can each comprise first inverters electrically connected in series and each portion of the global connector between adjacent nodes (i.e., between adjacent groups of local connectors) can comprise only a single first inverter. Specifically, the global connector 120 can comprise first inverters $121_1$-$121_8$ electrically connected in series and each portion of the global connector 120 between adjacent nodes (i.e., between adjacent groups of local connectors) can comprise only a single first inverter, as described in detail above with regard to the multi-bank RAM structure 100 of FIG. 1. Similarly, the global connector 320 can comprise first inverters $321_1$-$321_8$ electrically connected in series and each portion of the global connector 320 between adjacent nodes (i.e., between adjacent groups of local connectors) can comprise only a single first inverter. For example, the portion of the global connector 320 between the nodes $325_1$ and $325_2$ (i.e., between the local connector groups $335_1$ and $335_2$) comprises the single first inverter $321_2$; the portion of the global connector 320 between the nodes $325_2$ and $325_3$ (i.e., between the local connector groups $335_2$ and $335_3$) comprises the single first inverter $321_3$; the portion of the global connector 320 between the nodes $325_3$ and $325_4$ (i.e., between the local connector groups $335_3$ and $335_4$) comprises the single first inverter $321_4$, and so on.

Finally, as in the previously described embodiments, in alternating groups of local connectors across each of global connectors 120, 320, each of the local connectors can further comprise a second inverter for correcting the signal polarity (i.e., the data polarity) and for driving the signal to a single memory bank (i.e., for driving a single circuit load). However, in this case as mentioned above, positioning of the inverters on the global and local connectors is adjusted to provide a more even distribution of the second inverters across the multi-bank RAM structure 300. Specifically, in this embodiment, the global connectors can comprise at least two global connectors (e.g., a first global connector 120 and a second global connector 320) and one of these two global connectors (e.g., the second global connector 320) can incorporate an additional inverter 323 at the start of the line (i.e., connected in series and, particularly, directly coupled to the initial first inverter $321_1$).

In order to ensure that any first signals, which are received by any memory bank via the first global connector 120, and any second signals, which are received by any memory bank via the second global connector 320, are buffered by an even number of inverters and are thereby true signals, the second inverters can be located in the local connectors of the odd numbered groups of local connectors across the first global connector, as in the previously described embodiments, but, due to the presence of the additional inverter, in the even numbered groups of local connectors across the second global connector. For example, see the second inverters $131_{1a-d}$ and $131_{3a-d}$ in the local connectors $130_{1a-d}$ and $130_{3a-d}$ of the odd numbered groups $135_1$ and $135_3$ following odd numbers (i.e., 1, 3, etc.) of first inverters across the first global connector 120 and, contrarily, see the second inverters $331_{2a-d}$ and $331_{2a-d}$ in the local connectors $330_{2a-d}$ and $330_{2a-d}$ of the even numbered groups $335_2$ and $335_4$ which also follow an odd numbers (i.e., 3, 5, etc.) of inverters across the second global connector 320, given the incorporation of the additional inverter 323 prior to the initial first inverter $321_1$.

As mentioned above, the global connector(s) in the above-described embodiments can transmit different types of signals from different outputs of the memory controller 190. Such signals can include, but are not limited to, address signals (e.g., row address signals and column address signals), control signals (e.g., row address strobe (RAS) signals, column address strobe (CAS) signals, etc.), and data signals (e.g., write data signals). Thus, for example, in a multi-bank RAM structure 200 or 300, as described above, that support write masking, a first global connector 120 can transmit a first write data signal (e.g., a write "1" data signal) from the memory controller 190 to the local connectors of the various memory banks and a second global connector (e.g., such as the global connector 220 of FIG. 2 or 320 of FIG. 3) can transmit a second write data signal (e.g., a write "0" data signal) from the memory controller 190 to the local connectors of the various memory banks. Additionally, it should be noted that in the multi-bank RAM structures 200 and 300 described above and illustrated in FIGS. 2 and 3, the placement of the global connectors relative to the groups of banks is for illustration purposes only. In any of these embodiments, the local connector inputs to the memory banks may be located on opposite sides of the memory banks, as shown, or, alternatively, on the same or adjacent sides.

It should further be noted that in each of the embodiments described above (i.e., in the multi-bank RAM structures 100, 200, and 300 described above and illustrated in FIGS. 1-3, respectively), since the second inverters on the local connectors in the alternating groups are only required to drive a signal to a single memory bank (i.e., a single circuit load) the second inverters can be relative small in size compared to the first inverters. For example, the second inverters can comprise transistors with channel widths that are ⅓ to ½ the channel widths of the corresponding transistors in the first inverters. In one exemplary embodiment (e.g., in a 32-bank eDRAM structure, each second inverter can comprise a 3.0 μm channel width PFET and a 2.5 μm channel width NFET, whereas each first inverter can comprise a 6.0 μm channel width PFET and a 5.0 μm channel width NFET. Furthermore, in the multi-bank RAM structure 300 of FIG. 3, the additional inverter 323 can similarly be smaller in size than the first inverters (e.g., can comprise transistors with channel widths that are ⅓ to ½ the channel widths of the corresponding transistors in the first inverters) and can be the same size as or a different size than the second inverters. As a result of the reduced number of inverters on the global connector(s) and the relatively small second inverters on the alternating groups of local connectors, the embodiments described above provide for relatively fast slews and short propagation delays with minimal, if any, increase in area consumption. Additionally, due to the combination of first inverters on the global connector and second inverters on the local connectors in the alternating groups of local connectors, only half the signal line capacitance switches from low to high at any given time, thereby optimizing peak power consumption of the multi-bank RAM structures 100, 200, 300 as compared to conventional multi-bank RAM structures.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises", "comprising", "included", and/or "including", when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. Finally, it should be understood that the above-description of the embodiments was presented for purposes of illustration and was not intended to be exhaustive or limiting. Many modifications and variations will be apparent to those of ordinary skill in the art without departing from the scope and spirit of the disclosed embodiments.

Therefore, disclosed above are embodiments of a multi-bank random access memory (RAM) structure (e.g., a multi-bank embedded dynamic random access memory (eDRAM) structure or a multi-bank static random access memory (SRAM) structure) with a combination of global and local connector buffering for improved performance. Specifically, inverters are incorporated into the global connector(s), which traverse groups of memory banks, and into alternating groups of local connectors, which connect nodes on the global connector(s) to corresponding groups of memory banks, such that any signals (e.g., address signals or control signals) that are received by the memory banks from a memory controller via the global and local connectors are buffered by an even number of inverters and are thereby true signals. The combination of global and local signal buffering results in relatively fast slews, short propagation delays, and low peak power consumption with minimal, if any, increase in area consumption.

What is claimed is:

1. A memory structure comprising:
groups of memory banks, each group of memory banks comprising at least one memory bank;
a global connector traversing said groups of memory banks and comprising first inverters electrically connected in series; and
groups of local connectors electrically connecting nodes on said global connector to said groups of memory banks,
each group of local connectors comprising at least one local connector,
each portion of said global connector between adjacent nodes comprising a single first inverter, and
in alternating groups of local connectors across said global connector, each local connector further comprising a second inverter such that any signals received by any memory bank via said global connector are buffered by an even number of inverters.

2. The memory structure of claim 1, said signals comprising any of address signals, control signals and data signals.

3. The memory structure of claim 1, said second inverter being smaller than said first inverters.

4. The memory structure of claim 1, said memory banks comprising any of dynamic random access memory (DRAM) banks and static random access memory (SRAM) banks.

5. The memory structure of claim 1, said groups of memory banks comprising eight groups of four memory banks.

6. The memory structure of claim 1, wherein, due to the combination of said first inverters on said global connector and second inverters on said local connectors in said alternating groups of local connectors, only half the signal line capacitance switches from low to high at any given time, thereby optimizing peak power consumption of said memory structure.

7. A memory structure comprising:
groups of memory banks;
a plurality of global connectors traversing said groups of memory banks, each of said global connectors comprising first inverters electrically connected in series; and
groups of local connectors electrically connecting nodes on said global connectors to said groups of memory banks,
each group of local connectors comprising multiple local connectors electrically connecting a same node on one of said global connectors to different memory banks in a corresponding group of memory banks,
each portion of each of said global connectors between adjacent nodes comprising a single first inverter, and
in alternating groups of local connectors across each of said global connectors, each local connector further comprising a second inverter such that any signals received by any memory bank via any of said global connectors are buffered by an even number of inverters.

8. The memory structure of claim 7, said signals comprising any of address signals, control signals and data signals.

9. The memory structure of claim 7, said second inverter being smaller than said first inverters.

10. The memory structure of claim 7, said memory banks comprising any of dynamic random access memory (DRAM) banks and static random access memory (SRAM) banks.

11. The memory structure of claim 7, said groups of memory banks comprising eight groups of four memory banks.

12. The memory structure of claim 7, wherein, due to the combination of said first inverters on said global connectors and second inverters on said local connectors in said alternating groups of local connectors, only half the signal line capacitance switches from low to high at any given time, thereby optimizing peak power consumption of said memory structure.

13. A memory structure comprising:
groups of memory banks;
a plurality of global connectors comprising:
a first global connector traversing said groups of memory banks; and
a second global connector traversing said groups of memory banks,
said first global connector and said second global connector each comprising first inverters electrically connected in series, and
said second global connector further comprising an additional inverter connected in series to an initial one of said first inverters; and
groups of local connectors electrically connecting nodes on said global connectors to said groups of memory banks,
each group of local connectors comprising multiple local connectors electrically connecting a same node on one of said global connectors to different memory banks in a corresponding group of memory banks,
each portion of each of said global connectors between adjacent nodes comprising a single first inverter, and
in odd numbered groups of local connectors across said first global connector and in even numbered groups of local connectors across said second global connector, each local connector further comprising a second inverter such that first signals received by any memory bank via said first global connector and second signals received by said any memory bank via said second global connector are buffered by an even number of inverters.

14. The memory structure of claim 13, said first signals and said second signals comprising any of address signals, control signals and data signals.

15. The memory structure of claim 13, said second inverter being smaller than said first inverters.

16. The memory structure of claim 13, said additional inverter being smaller than said first inverters.

17. The memory structure of claim 13, said memory banks comprising any of dynamic random access memory (DRAM) banks and static random access memory (SRAM) banks.

18. The memory structure of claim 13, said groups of memory banks comprising eight groups of four memory banks.

19. The memory structure of claim 13, wherein, due to the combination of said first inverters on said global connectors and second inverters on said local connectors in said odd numbered groups of local connectors across said first global connector and in said even numbered groups of local connectors across said second global connector, only half the signal line capacitance switches from low to high at any given time, thereby optimizing peak power consumption of said memory structure.

20. A memory structure comprising:
groups of memory banks;
a plurality of global connectors comprising:
- a first global connector traversing said groups of memory banks; and
- a second global connector traversing said groups of memory banks,
- said first global connector and said second global connector each comprising first inverters electrically connected in series, and
- said second global connector further comprising an additional inverter connected in series to an initial one of said first inverters; and groups of local connectors electrically connecting nodes on said global connectors to said groups of memory banks,
each group of local connectors comprising multiple local connectors electrically connecting a same node on one of said global connectors to different memory banks in a corresponding group of memory banks,
each portion of each of said global connectors between adjacent nodes comprising a single first inverter, and
in odd numbered groups of local connectors across said first global connector and in even numbered groups of local connectors across said second global connector, each local connector further comprising a second inverter such that first write data signals received by any memory bank via said first global connector and second write data signals received by said any memory bank via said second global connector are buffered by an even number of inverters.

21. The memory structure of claim 20, said first write data signals comprising write 1 data signals and said second write data signals comprising write 0 data signals.

22. The memory structure of claim 20, said second inverter being smaller than said first inverters.

23. The memory structure of claim 20, said additional inverter being smaller than said first inverters.

24. The memory structure of claim 20, said memory banks comprising any of dynamic random access memory (DRAM) banks and static random access memory (SRAM) banks.

25. The memory structure of claim 20, wherein, due to the combination of said first inverters on said global connectors and second inverters on said local connectors in said odd numbered groups of local connectors across said first global connector and in said even numbered groups of local connectors across said second global connector, only half the signal line capacitance switches from low to high at any given time, thereby optimizing peak power consumption of said memory structure.

* * * * *